FACE BONDING OF SEMICONDUCTOR DEVICES

Original Filed July 19, 1966 3 Sheets-Sheet 1

INVENTOR.
BASIL WEIR
BY Leo A. Plum, Jr.
ATTORNEY

INVENTOR.
BASIL WEIR
BY
ATTORNEY

March 17, 1970 B. WEIR 3,501,681

FACE BONDING OF SEMICONDUCTOR DEVICES

Original Filed July 19, 1966 3 Sheets-Sheet 3

INVENTOR
BASIL WEIR
BY Leo A. Plumb
ATTORNEY

United States Patent Office 3,501,681
Patented Mar. 17, 1970

3,501,681

FACE BONDING OF SEMICONDUCTOR DEVICES

Basil Weir, San Jose, Calif., assignor to Union Carbide Corporation, a corporation of New York Continuation of application Ser. No. 566,355, July 19, 1966. This application Jan. 6, 1969, Ser. No. 792,200
Int. Cl. H01l 3/00, 5/00, 7/00
U.S. Cl. 317—234 15 Claims

ABSTRACT OF THE DISCLOSURE

Planar type semiconductive devices and integrated circuits suited for direct bonding to a packaging unit are provided wherein raised contact elements on the semiconductor devices are formed as homogeneous metal deposits metallurgically bonded to the metallization pattern on the semiconductor device. A process for forming such homogeneous metal deposits by electroforming is provided.

This application is a continuation of application Ser. No. 566,355, filed July 19, 1966.

This invention relates to a method of fabrication of semiconductor devices and more particularly to a method for packaging such devices.

The final stage in the production of semiconductor devices involves the assembly of the silicon dice in suitable packages and the making of the electrical connections between the contact areas on each die and the package leads. A conventional technique for accomplishing this involves attaching the die to the header of a transistor-type "can" package or the base plate of flat-type package, as by soldering. Electrical connections to the package leads are commonly made by bonding fine wires first to the appropriate contact areas on the die and then to the corresponding lead, as by thermocompression bonding. The packaging of even a simple transistor device will require at least five electrical connections to be made, including four wire bonding operations. The packaging of integrated circuit devices where several active and passive components are formed on one silicon chip and in which up to 14 lead connections might be called for, involves twice that number of individual bonding operations. It is easily understood that a reduction in the number of such manual operations would be desirable.

A more recently developed packaging system does eliminate the need for these individual bonding operations by providing for direct bonding of the metal contact areas on the silicon die to either a mating metallized pattern on an insulated substrate, or to the ends of leads or clips arranged in a package so as to overlap the silicon die. It has not heretofore been possible, however, to provide face bonded devices of the type described which have the reliability of the conventional wire bonded devices. Since mechanical interconnections have been found to be one of the most common sites of failure in semiconductor devices, it is essential for the full commercialization of direct bonding techniques that improved electrical contacting means be provided.

It is the primary object of this invention therefore to provide means for direct bonding silicon semiconductor devices to their packaging assemblies, which units will then have the same high reliability and freedom from mechanical failures as the conventional wire bonded devices.

It is another object of this invention to provide a technique for face bonding semiconductor devices which is simple, highly reliable and easily adapted to automatic processing.

It is a further object of this invention to provide a contacting means for semiconductor devices which yields high performance electrical connections using materials and methods compatible with existing semiconductor devices and their methods of fabrication.

Other aims and advantages of this invention will be apparent from the following description, the appended claims, and the attached drawings.

In accordance with these objects a process is provided for making electrical contacts on a semiconductor device for direct bonding to the electrical connectors of a semiconductor device packaging unit, comprising providing a body of semiconductive material having as a part thereof active or passive microelectronic devices, forming on a surface of said body a metallized film pattern providing ohmic contacts to the appropriate regions of the active or passive devices and interconnected to corresponding portions of said film selected as the contact sites for direct bonding to the electrical connectors of the packaging unit, forming a first layer of a removable insulating firm over the surface of said body with openings therein to the underlying metallized film in the vicinity of the selected external contact sites, forming a second metallized film over the surface of the insulating layer, said film extending over the openings in said layer to contact the underlying metallized film, forming a second layer of a removable insulating material over the second metallized film with openings in said second layer in the vicinity of the selected external contact sites, electrodepositing a metal deposit only on the exposed areas of the second metallized film as defined by the openings in the second insulating layer to form external contact elements or buttons raised above the surface of the body, and then removing the second and first layers of insulating material, and second metallized film therebetween except in the vicinity of the raised contact elements to leave the raised elements of metallurgically bonded metal.

More specifically, the invention comprises providing a silicon body having a plane surface and having active or passive devices as a part thereof, the surface of said body and said devices at least partially covered with a layer of silicon oxide with openings in the oxide layer over the appropriate contacting regions of the underlying devices, forming a metallized film pattern over the surface of the body making electrical contact to the appropriate regions of said devices in the vicinity of the openings in the oxide layer and interconnecting these contacts to corresponding portions of said film pattern selected as the external contact sites for direct bonding to the electrical connectors of a packaging unit, forming a first layer of photo-resist over the surface of the body with openings therein to the underlying metallized film in the vicinity of the selected external contact sites, forming a second metallized film over the surface of the photo-resist layer, said film extending over the openings in the photo-resist layer and making contact to the underlying first metallized film in the vicinity of the selected contact sites, forming a second layer of photo-resist over the second metallized film with openings in the photo-resist layer in the vicinity of the selected external contact sites, electrodepositing a metal deposit on the exposed areas of the second metallized film the cathode in a solution for electroplating the metal to be deposited, and continuing the electrodeposition to form external contact elements or buttons on the selected external contact sites and raised above the surface of the oxide-covered body, and removing the second and first photo-resist layers by dissolving, whereby the second metallic film therebetween is lifted off the surface of said body except in the vicinity of the selected contact sites thereby leaving the raised contact elements.

In a preferred embodiment of the invention the second metallized film is a gold film and the electrodeposited metal is also gold, whereby raised gold contact elements are produced at the selected sites. The finished semiconductor body can be face bonded to a mating set of leads in a packaging unit by brazing the raised gold contact elements to the leads of the packaging unit. The resulting connection will be electrically and mechanically superior because the raised contact elements provided by this invention are metallurgically bonded and homogeneous metal deposits.

The invention also includes the use of a molybdenum and gold contacting system as set forth in the following method whereby a silicon body is provided having a plane surface and having active or passive devices as a part thereof, the surface of said body and said devices being at least partially covered with a layer of silicon oxide with openings in the oxide layer over the appropriate contacting regions of the underlying devices, a metallized composite film pattern is formed over the surface of the body making electrical contact to the appropriate contacting regions of said devices in the vicinity of the openings in the oxide layer and interconnecting these electrode contacts to a portion of the composite film located on the oxide surface and selected as the external contact areas for direct bonding to the electrical connectors of a packaging unit, said composite metallized film pattern comprising a molybdenum film and a gold film thereover, both films preferably formed by sputtering, a first coating of photo-resist is then formed over the surface of the body with openings in said photo-resist in the vicinity of the selected external contact sites exposing the gold film thereunder, a second film of gold is formed over the surface of said photo-resist, as by evaporation, said film extending over the openings in the photo-resist to cover and make electrical contact to the underlying gold film there, a second coating of photo-resist is then formed over the gold film with openings in this photo-resist layer in the vicinity of the selected contact sites, gold is then electrodeposited over the selected contact sites by making the second gold film the cathode in a gold electroplating solution, the electrodeposition is continued to form gold contact elements raised above the surface of the oxide covered body, and then the second photo-resist layer and then the first photo-resist layer are removed, at the same time lifting off the second gold film between the layers of photo-resist except in the vicinity of the contact sites thereby leaving raised gold contact elements.

The invention will be further defined by reference to the drawings wherein.

Figure 1:
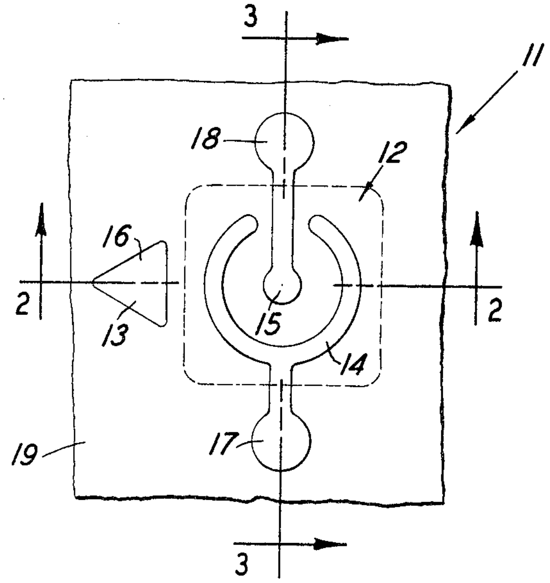
FIG. 1 is a schematic representation in plan view of a portion of a body of semiconductive material having a single transistor device formed therein, greatly exaggerated in size and not necessarily in exact proportions.

Referring now to FIG. 1 a body 11 of semiconductive material such as silicon is shown. This body 11 has had formed therein a transistor device indicated generally at 12 and having collector 13, base 14, and emitter 15 contacts on the surface of the body. The body 11 may be a portion of a larger wafer of silicon and will represent one of a large number of discrete transistor devices which can be formed simultaneously in the wafer. The body 11 may also be a portion fo an integrated circuit device wherein several transistors or other active or passive microelectronic devices are formed simultaneously in each of many similar portions of a wafer. In an integrated circuit these other devices might be connected to the transistor shown here by a thin metallization pattern and would have their own contacts as needed. For the purpose of illustrating the procedures of this invention, it is only necessary to show the treatment of one such electronic device, and it is not important whether it be a discrete device as shown or a part of an integrated circuit. It will be understood by those skilled in the art that similar discrete devices as well as all manners of integrated circuits may be processed using the methods claimed herein to provide contacts for direct bonding to packaging units.

Figure 2:
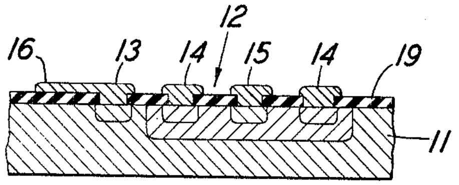
FIG. 2 is a schematic elevational view in cross section taken along line 2—2 of FIG. 1.

As stated above, the device shown in FIGS. 1 and 2 has a thin film metallization pattern formed over the oxide coating 19 on the device which provides electrical contacts to the collector, base and emitter regions of the transistor. Bonding pads 16, 17 and 18 are also provided for bonding to the leads of the packaging unit. These pads 16, 17 and 18 are a part of the metallization pattern and are formed at the same time as the contacts to the transistor collector, base and emitter regions. The metallization pattern can be formed by evaporating aluminum over the whole of the oxide covered surface of the body and then removing the aluminum film from all areas except the desired pattern, as shown in FIGS. 1 and 2.

Figure 3:
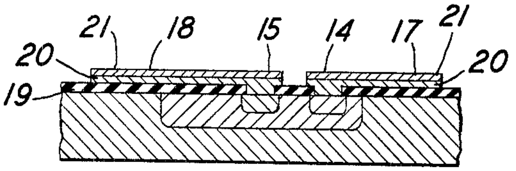
FIG. 3 is a schematic elevational view in cross section taken along line 3—3 of FIG. 1.

In the preferred practice of the present invention a metallization pattern is formed as follows: first, an aluminum film can be evaporated over the surface of the body and particularly over the openings provided in the oxide layer defining the collector, base and emitter contact regions. The aluminum is alloyed into the silicon in these regions by heating at high temperatures to form ohmic contact regions there. The residual aluminum is removed from the surface of the body, as by etching. Referring now to FIG. 3, film 20 of molybdenum is then sputtered over the surface of the body including the openings in the oxide layer over the aluminum diffused collector base, and emitter regions. A film 21 of gold is then sputtered over the surface of the molybdenum film. The desired pattern is then formed by etching away the gold and then the molybdenum from the unwanted areas leaving a pattern for example as shown in FIGS. 1 and 3.

This process of providing sputtered molybdenum-gold metallization patterns is more fully explained in the copending patent application of John M. Hall, entitled "Electrical Connection And Method," Ser. No. 562,379 filed July 1, 1966, new U.S. Patent No. 3,437,888.

The invention will be further explained in regard to the view shown in FIG. 3 of the drawings wherein the base contact 14 and emitter contact 15 are shown. The selected external contact site for the base electrode is the portion 17 of the metallized film pattern; and the selected external contact site for the emitter electrode is the portion 18 of the metallization film. The collector contact 13 and external contact site 16 are not seen in these views, but are treated in the same manner as the visible regions.

Figure 4:
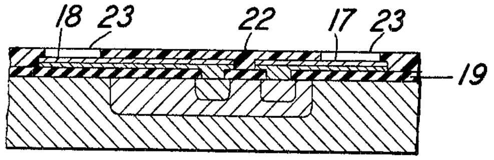
FIGS. 4 through 8 are additional schematic elevational views corresponding to FIG. 3 showing the device of this invention in various stages of fabrication.
Figure 5:
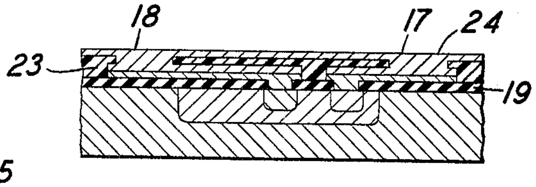
Figure 6:
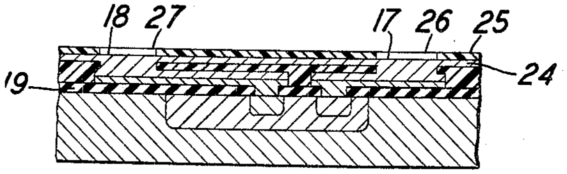
Figure 7:
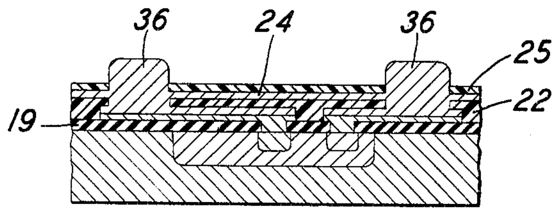

Starting with a body as in FIG. 3 the following procedure is now followed: a layer 22 of removable insulating material such as a photo-resist compound is applied over the surface of the body, as shown in FIG. 4. Conventional techniques for spinning on such a coating can be followed whereby a wafer containing many devices such as shown here is spun about its central axis and a quantity of liquid photo-resist is placed at the center of the spinning wafer. The photo-resist will be spread out to a uniform thickness. Openings 23 are provided in the photo-resist layer 22 over the selected contact sites 17 and 18 by conventional light exposure and developing techniques whereby the photo-resist over the selected contact site areas is removed. A film 24 of gold is then deposited over the photo-resist covered surface 22, as shown in FIG. 5. This gold film can be provided by evaporation. The gold film 24 will metallugrically bond to the underlying gold contact site areas 17 and 18 in the vicinity of the openings 23 in the photo-resist layer. A second layer 25 of insulating material, such as photo-resist is now applied over the gold film 24, as by spinning. Openings 26 and 27 are again provided in this layer 25 of photo-resist in the vicinity of the selected contact site areas 17 and 18, thereby exposing the underlying areas of the previously applied gold film. The device as shown in FIG. 6 is now ready for the formation of the raised contact elements.

Figure 8:
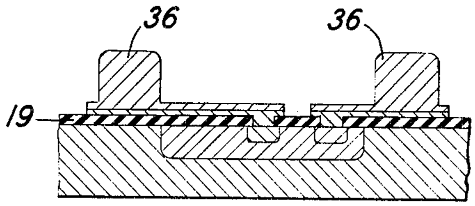
Figure 9:
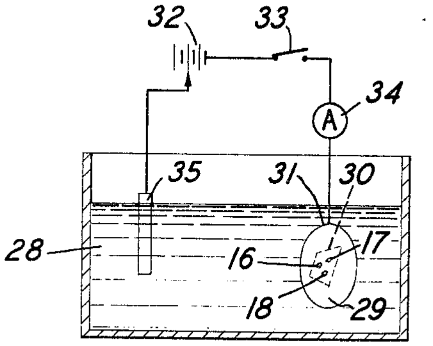
FIG 9 is schematic representation of the electrodeposition of the contact elements according to the process of this invention.

Referring first to FIG. 9 there is shown an apparatus suitable for electroforming the raised contact elements. A bath 28 of gold electroplating solution is shown with a wafer 29 supported therein by any suitable means. The wafer contains many devices as outlined above and is provided with the metallized film pattern, first layer of photo-resist, intermediate gold film, and second layer of photo-resist as applied above. Each layer of photo-resist has the openings called for above in the vicinity of the selected contact sites. A portion 30 of the wafer is outlined to represent the body illustrated in FIGS. 1 to 8, it being understood that such a body actually represents a much smaller portion of the wafer area than is schematically shown in FIG. 9. This portion 30 has three openings in the second photo-resists layer over the selected contact sites 16, 17 and 18. The intermediate gold film 24 is made the cathode, as by attaching a wire and a clip 31 to the wafer penetrating the second photo-resist layer and making electrical contact with this gold film. The wire is connected to the negative side of a direct current power supply 32. The electrical circuit is completed by switch 33, ammeter 34 and a platinum anode 35. When the switch is closed, the gold film on the body is maintained negative with respect to the anode and acts as an equipotentional cathode surface. Electrons are thus made available from the gold film 24 at the surface portions thereof exposed under the openings, for example 26 and 27 in FIG. 6, in the second photo-resist layer in the vicinity of the contact sites 16, 17 and 18. Gold cations from the electroplating bath pick up available electrons at these surfaces and metallic gold is deposited. No gold will be deposited on the insulating photo-resist layer 25. The deposition is continued until gold contact elements 36 or buttons of the desired height are built up.

These gold contact elements should be formed to a height of between ½ and 3 mils. The gold contact elements should be high enough to prevent any possible shorting of devices on the semiconductor body to the package leads. In this regard, it is to be understood that microelectronic devices, such as resistors and capacitors, may be formed over the surface of the semiconductor body rather than diffused into its surface. In such cases the gold contact elements are made as previously described and electroformed to a height sufficient to clear such raised structures. The provision of a gap between the surface of the semiconductor body, any structures formed thereon, and the leads of the packaging unit insures good insulation between these parts. The configuration and lateral dimensions of the gold contact elements 36 are determined by the geometry of the openings in the photo-resist layer.

The gold plating bath may be formed by adding an ionic compound of gold to a suitable solution wherein the compound dissociates to produce gold cations as well as anions of the compound employed. A suitable gold plating solution can be made using Auro-vel, a product of Lea-Ronal, Inc., Long Island City, N.Y. Using this material in an aqueous gold plating solution according to the manufacturer's instructions, and with a current density at the cathode of about 270 ma. square inch, a gold deposition rate of about 1 micro inch per second is achieved.

After the desired deposit of gold has been provided, the switch is opened and the wafer removed from the electroplating bath. The layers 22 and 25 of photo-resist are removed as by dissolving in suitable solvents. The intermediate gold film 24 will be lifted off the body as the lower or first layer 22 of photo-resist is removed, except in the vicinity of the external contact sites 16, 17 and 18 where there was no photo-resist. The finished device is shown in FIG. 8 with the oxide layer 19 again exposed and the gold contact elements 36 rising above the surface of the oxide. A gold contact element will also be located at the collector external contact site 16, not shown in the sectional views of FIGS. 3 to 8.

The photo-resist compounds for the first and second layers are selected to be easily removable. This property is particularly desirable in the first layer of photo-resist which must lift off the intervening gold film at the same time it, the photo-resist, is removed. A suitable material for this first photo-resist layer is AZ1340, a product of the Shipley Co., Inc., Newton, Mass., which can be removed using an acetone solvent. The second layer of photo-resist must not only be easily removable, but also must be resistant to the electroplating bath, which can be alkaline. KTFR photo-resist made by the Eastman Kodak Co., Rochester, N.Y., is suitable for this layer and can be removed with an amino ethanol solution. Other suitable material could be used providing they are easily removable and, in the case of the layer exposed to the electroplating solution, have the required chemical inertness.

The raised contact elements formed by the process of this invention are soft, highly conductive, ductile, and non-corrosive. Because of their method of fabrication they are metallurgically bonded over the whole of the intended contact area of the metallization pattern formed on the body. The elements are free of interface defects and discontinuities and have a uniform, homogeneous structure.

The prior art practice for providing contacting buttons employed such processes as solid-liquid soldering, or the dipping of an oxide-coated device into molten lead-gold baths to pick up drops of metal on the exposed contact sites. Such procedures result in dry or non-wetted joints wherein the raised element is not metallurgically bonded to the underlying contact site on the metallization pattern. Such contacts have high resistance and make unreliable connections. The contacts formed using the process of this invention have low resistance and are structurally stronger and more reliable.

Figure 10:
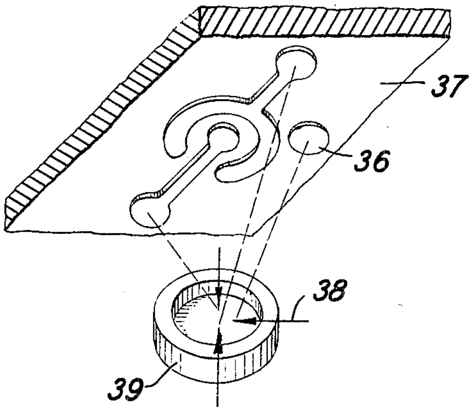
FIG. 10 is a perspective view of the device of this invention as it is prepared for packaging.

The finished device 37 is shown in FIG. 10 ready for packaging in a flat-type package. The semiconductor body is lowered into position over the leads 38 of the package and the gold contact elements 36 are brazed to the mating leads 38. Package component 39 and another similar unit are closed over the leads 38 and device 37 supported thereon, and sealed together.

Figure 11:
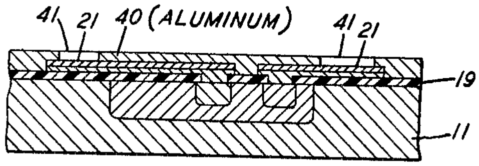
FIGS. 11 through 13 are schematic elevational views relating to another embodiment of the process of this invention and showing the device in varying stages of fabrication according to that process embodiment.
Figure 12:
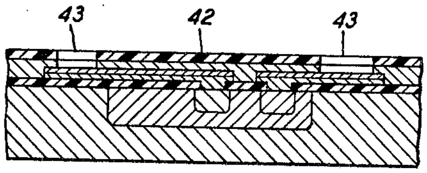
Figure 13:
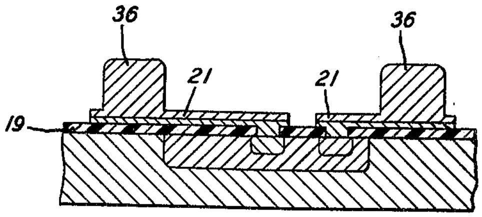

In another embodiment of the invention the following procedure is followed: after the metallization pattern is formed on the oxide covered semiconductor body, a film of a removable metal such as aluminum, copper, nickel, etc., is formed over the surface of the body, as by evaporation, electroless plating, etc.; holes are etched in the metal film over the selected external contact sites, thereby exposing the underlying gold metallization; a layer of photo-resist is applied over the metal film with openings in the photo-resist in the vicinity of the openings in the underlying metal film, i.e., over the selected contact sites. The gold contact elements are then formed by electro-deposition, utilizing the removable metal film as the cathode in the electroplating solution. When the contact elements are formed, the photo-resist layer and metal film are removed. The metal film is removed using etchants which will not attack the gold contact elements or the underlying metallization pattern on the semi-conductor body. The process embodiment described above is illustrated in FIGS. 11 to 13 as follows: FIG. 11 shows a semiconductor device comprising a body 11 of semiconductor material having regions of differing conductivity diffused therein. An oxide coating 19 covers the surface of the body 11 and has openings over the diffused regions. A metallization pattern comprising, for example, a layer of molybdenum and an overlying layer 21 of gold, overlies the oxide film and makes electrical contact to the silicon under the openings in the oxide coating 19. A film 40 of a removeable metal such as aluminum is then formed over the surface of the device covering the oxide coating 19 and gold metallization pattern 21 except in the vicinity of the desired raised contact elements where openings 41 is left in the aluminum exposing the gold layer thereunder. Referring now to FIG. 12, a layer 42 of photo-resist is then applied over the aluminum film 40 with openings 43 in this photo-resist layer in registry with the openings 41 in the aluminum film. The so-formed device is then inserted in the electroplating apparatus of FIG. 9 with the aluminum film 40 made the cathode by attachment of the clip 31 to the wafer so as to penetrate the photo-resist layer 42 and electrically contact the aluminum film 40. When sufficient gold is electrodeposited into the openings 43 to form raised contact elements 36 over the gold layer 21, the wafer is removed from the electroplating apparatus. The photo-resist layer 42 is removed and the aluminum film 40 is then removed using etchants which will not attack the gold contact elements or underlying metallization pattern on the semiconductor body. The raised contact elements 36 will have a structure as shown in FIG. 13.

It is to be understood that while the invention has been illustrated in terms of a junction transistor, that other active devices, such as, but not limited to, field effect devices can be employed. Such devices may be formed using a planar process or may be formed as MOS devices having portions raised above the surface of the semiconductor body. In such a case, the metallized film pattern is formed to contact the appropriate regions of the device and the raised external contact elements are formed as taught herein at selected sites on the metallized film pattern, or directly over the semiconductor device elements, as desired. In this regard it is to be further understood that the use herein of the term microelectronic devices means one or more such active or passive electronic devices no matter how formed on or in the semiconductor body. Additionally it is understood that the use of the procedures set forth herein in forming raised contact elements on inert substrates containing active or passive electronic devices is also within the scope of this invention.

What is claimed is:

1. A process for making electrical contact elements to a semiconductor device comprising the steps of:

(a) providing a body having as a part thereof at least one semiconductive microelectronic device, (b) forming on a surface of said body a first metallized film pattern providing ohmic contacts to the appropriate regions of the microelectronic devices with corresponding portions of said film pattern selected as external contact sites for direct bonding to the leads of a packaging unit, (c) forming a first layer of a removable insulating material over the surface of said body with openings in said layer to the underlying metallized film in the vicinity of the selected external contact sites, (d) forming a second metallized film over the entire surface of the insulating layer, said second film extending over the openings in said first insulating layer to contact the underlying first metallized film, (e) forming a second layer of a removable insulating material over the second metallized film with openings in said second layer in the vicinity of the selected external contact sites, (f) electrodepositing a metal deposit on the exposed areas of the second metallized film underneath the openings in the second insulating layer by using the second metallized film as the cathode in an electroplating solution containing cations of the metal to be deposited to form external contact elements raised above the surface of the semiconductor body, (g) and removing the second and first layers of insulating material, and second metallized film therebetween except in the vicinity of the raised external contact elements.

2. A process for making electrical contact elements on a semiconductor device comprising the steps of:

(a) providing a silicon body having a plane surface and having at least one microelectronic device formed as a part thereof, the surface of said body at least partially covered with a layer of silicon oxide with openings in the oxide layer over the appropriate contacting regions of the microelectronic devices, (b) forming on the surface of said oxide covered body a first metallized film pattern providing ohmic contacts to the appropriate regions of the microelectronic devices in the vicinity of the openings in the oxide layer and interconnecting these regions with corresponding portions of said film pattern selected as external contact sites for direct boding to the leads of a packaging unit, (c) forming a first layer of photo-resist over the surface of the body with openings in said layer to the underlying film in the vicinity of the selected external contact sites, (d) forming a second metallized film over the surface of the first photo-resist layer, said film extending over the openings in the photo-resist layer and making contact to the underlying first metallized film, (e) forming a second layer of photo-resist over the second metallized film with openings in this photo-resist layer in the vicinity of the selected external contact sites, (f) electrodepositing a metal deposit on the exposed areas of the second metallized film underneath the openings in the second photoresist layer by making the second metallized film the cathode in a solution for electrodepositing the metal to be deposited, and continuing the electrodeposition to form external contact elements raised above the surface of the oxide-covered body, (g) and removing the second and first photo-resist layers, and second metallized film therebetween except in the vicinity of the raised contact elements.

3. The process as in claim 2 in which the first metallized film pattern is formed by first sputtering a film of molybdenum over the surface of the body, and then sputtering a film of gold over the molybdenum film.

4. The process as in claim 3 in which the second metallized film is a gold film.

5. The process as in claim 4 in which the electrodeposited metal is gold.

6. The process as in claim 2 in which the photo-resist in the first layer is an easily removable photo-resist and in which the photo-resist in the second layer is chemically resistant to the electroplating solution.

7. The process as in claim 2 in which the electroplating solution is a gold electroplating solution whereby gold contact elements are formed, and continuing said electroplating step until these elements are formed to a height of between ½ and 3 mils.

8. A process for making electrical contact elements on a semiconductor device comprising the steps of:

(a) providing a silicon body having a substantially plane surface and having at least one microelectronic device formed as a part thereof, the surface of said body and said device at least partially covered with a layer of silicon oxide with openings in the oxide layer over the appropriate contacting regions of the underlying microelectric devices, (b) evaporating a film of aluminum over the surface of said body including the silicon surfaces exposed under the openings in the oxide layer, and diffusing aluminum into said exposed silicon surfaces to form ohmic contacts with the underlying regions of the microelectronic devices, and then removing the residual aluminum at the surface, (c) sputtering a film of molybdenum over the surface of the body and then sputtering a film of gold over the molybdenum film, said films extending over the exposed aluminum-diffused contact regions of the underlying microelectronic devices in the vicinity of the openings in the oxide layer, and thereupon removing the gold film and then the molybdenum film except in the vicinity of the exposed surface regions of the silicon to be contacted and corresponding selected external contact sites on the oxide-covered surface and an interconnecting pattern therebetween.

(d) forming a first layer of photo-resist over the surface of the body with openings in the photo-resist layer to the underlying gold film in the vicinity of the selected external contact sites, (e) evaporating a second film of gold over the surface of the first photo-resist layer, said gold film extending over the openings in the photo-resist layer and adherently bonded to the underlying sputtered gold film, (f) forming a second layer of photo-resist over the second evaporated gold film with openings in this photo-resist layer in the vicinity of the selected external contact sites, (g) electrodepositing gold on the exposed areas of the evaporated gold film underneath the openings in the second photo-resist layer by making the evaporated gold film the cathode in a solution for electroplating gold, and continuing to deposit gold to form raised contact elements having a height of between ½ and 3 mils, (h) and removing the second and first photo-resist layers, and evaporated gold film therebetween except in the vicinity of the raised gold contact elements.

9. A process for making electrical contact elements on a semiconductor device comprising the steps of:

(a) providing a silicon body having a plane surface and having at least one microelectronic device formed as a part thereof, the surface of said body at least partially covered with a layer of silicon oxide with openings in the oxide layer over the appropriate contacting regions of the underlying microelectronic devices, (b) forming on the surface of said oxide covered body a first metallized composite film pattern providing electrical contact to the appropriate regions of the microelectronic devices in the vicinity of the openings in the oxide layer and interconnecting these regions with corresponding portions of said film pattern selected as external contact sites for direct bonding to the leads of a packaging unit, said composite metallized film having as its upper surface a gold film, (c) forming a second metallized film over the surface of the body, said second film being composed of a metal easily removed from the body without damage to the previously deposited composite metallized film, (d) forming openings in said second metallized film to the underlying gold surface in the vicinity of the selected external contact sites, (e) forming a layer of photo-resist over the surface of the second metallized film with openings in said layer in the vicinity of the selected external contact sites, (f) electrodepositing gold on the exposed areas of the gold-surfaces first metallized film by making the second metallized film the cathode in a solution for electroplating gold, and continuing to deposit gold to form raised gold contact elements having a height of between ½ and 3 mils, (g) and removing the layer of photo-resist and second metallized film leaving the raised gold contact elements adherently bonded to the underlying gold-surfaces first metallized film pattern.

10. The process as in claim 9 in which the second metallized film is composed of a metal selected from the group consisting of aluminum, copper and nickel.

11. An electronic device comprising:

(a) a silicon body having a substantially plane surface and having at least one microelectronic device formed as a part thereof, the surface of said body at least partially covered with a layer of silicon oxide with openings in the oxide layer over the appropriate contacting regions of the underlying microelectronic devices, (b) a first composite metallized film pattern partially covering the oxide-coated body providing ohmic contacts to the appropriate regions of the microelectronic devices in the vicinity of the openings in the oxide layer and interconnecting these regions with corresponding portions of the film pattern selected as external contact sites for direct bonding to the leads of a packaging unit, the upper surface film of said pattern being gold, (c) areas of a second metallized film gold overlying and adherently bonded to the gold-surfaced first film pattern in the vicinity only of the selected external contact sites, (d) and raised gold contact elements electroplated to the second metallized gold film areas in the vicinity of the selected external contact sites, said electroplated raised elements extending above the highest point on said metallized body and forming with the underlying portions of the metallized film pattern a low resistance, dense, metallurgically continuous, uniform and homogeneous structure.

12. The device as in claim 11 in which the first composite metallization pattern comprises a sputtered film of molybdenum and a sputterd film of gold over the molybdenum.

13. The device as in claim 11 in which the microelectronic device is a junction transistor formed in the silicon body.

14. The device as in claim 11 in which the microelectronic device is a field effect transistor.

15. The device as in claim 11 in which the microelectronic devices comprise at least one active device and at least one passive device connected to form an integrated circuit.

References Cited

UNITED STATES PATENTS 3,323,956 6/1967 Gee ............... 317—234

OTHER REFERENCES

Electronics, "Diode Sheds its Costly Package with Beam-lead Construction," by Thomas et al., Jan. 24, 1966 pp. 77–81.

JERRY D. CRAIG, Primary Examiner

U.S. Cl. X.R.

29—589, 590